(12) United States Patent
Ma et al.

(10) Patent No.: US 9,236,556 B2
(45) Date of Patent: Jan. 12, 2016

(54) POLYMER COMPOSITE ACTUATOR AND GENERATOR DRIVEN BY WATER GRADIENTS

(71) Applicants: Massachusetts Institute of Technology, Cambridge, MA (US); The Brigham and Women's Hospital, Inc., Boston, MA (US)

(72) Inventors: Mingming Ma, Boston, MA (US); Liang Guo, Columbus, OH (US); Daniel G. Anderson, Sudbury, MA (US); Omid C. Farokhzad, Waban, MA (US); Robert S. Langer, Newton, MA (US)

(73) Assignees: Massachusetts Institute of Technology, Cambridge, MA (US); The Brigham and Women's Hospital, Inc., Boston, MA (US)

( * ) Notice: Subject to any disclaimer, the term of this patent is extended or adjusted under 35 U.S.C. 154(b) by 60 days.

(21) Appl. No.: 14/071,482

(22) Filed: Nov. 4, 2013

(65) Prior Publication Data
US 2014/0125196 A1    May 8, 2014

Related U.S. Application Data

(60) Provisional application No. 61/721,639, filed on Nov. 2, 2012.

(51) Int. Cl.
*C08J 3/075*        (2006.01)
*H01L 41/193*     (2006.01)
*H01L 41/37*       (2013.01)
(Continued)

(52) U.S. Cl.
CPC .............. *H01L 41/193* (2013.01); *C08J 3/075* (2013.01); *H01L 41/37* (2013.01); *C08G 2210/00* (2013.01); *C08G 2261/3221* (2013.01);
(Continued)

(58) Field of Classification Search
CPC .......................................................... C08J 3/075
USPC ...................... 528/423, 80; 310/311; 205/414
See application file for complete search history.

(56) References Cited

U.S. PATENT DOCUMENTS

2006/0057451 A1   3/2006   Okuzaki
2012/0123196 A1   5/2012   Rion

FOREIGN PATENT DOCUMENTS

JP          2011236311          11/2011

OTHER PUBLICATIONS

Beebe, et al., "Functional hydrogel structures for autonomous flow control inside microfluidic channels", Nature, 404:588-90 (2000).
(Continued)

*Primary Examiner* — Duc Truong
(74) *Attorney, Agent, or Firm* — Pabst Patent Group LLP

(57) ABSTRACT

Water-responsive composite materials are provided containing a polymeric matrix and a water-responsive gel integrated into the polymeric matrix. The water-responsive gel can include a polyol or an alkoxylated polyol crosslinked by reversibly hydrolysable bonds, such as borate ester bonds. The polymeric matrix can include conjugated polymers such as poly(pyrrole) containing polymers. The composite material is capable of rapid actuation in the presence of a water gradient and can exhibit power densities greater than 1 W/kg. Methods of making water-responsive composite materials are provided, including by electropolymerization. Devices containing water-responsive composite materials are provided for sensing, locomotion, and power generation.

32 Claims, 7 Drawing Sheets

(51) Int. Cl.
 C08K 5/55 (2006.01)
 C08L 65/00 (2006.01)
(52) U.S. Cl.
 CPC ......... *C08G2261/44* (2013.01); *C08J 2371/02* (2013.01); *C08J 2465/00* (2013.01)

(56) References Cited

OTHER PUBLICATIONS

Caldorera-Moore, et al., "Responsive Theranostic Systems: Integration of Diagnostic Imaging Agents and Responsive Controlled Release Drug Delivery Carriers", Acc. Chem. Res.,44(10):1061-70 (2011).
Camacho-Lopez, et al., "Fast liquid-crystal elastomer swims into the dark", Nature Mater., 3:307-10 (2004).
Chen, et al., "Graft copolymers that exhibit temperature-induced phase transitions over a wide range of pH", Nature, 373:49-52 (1995).
Fratzl, et al., "Biomaterial systems for mechanosensing and actuation", Nature, 462:442-8 (2009).
Guiseppi-Elie, "Elecrroconductive hydrogels: synthesis, characterization and biomedical aplications", Biomaterials, 31(10):2701-16 (2010).
Jager, et al., "Microfabricating conjugated polymer actuators", Science, 290:1540-5 (2000).
Kim, et al., "Designing responsive buckled surfaces by halftone gel lithography", Science, 335:1201-5 (2012).
Lendlein, et al., "Biodegradable, elastic shape-memory polymers for potential biomedical applications", Science, 296:1673 (2002).
Okuzaki, et al., "Theoretical study of sorption-induced bending of polypyrrole films", J. Polym. Sci. Polym. Phys., 36:2237-46 (1998).
Osada, et al., "A polymer gel with electrically driven motility", Nature, 355:242-44 (1992).
Sidorenko, et al., "Reversible switching of hydrogel-actuated nanostructures into complex micropatterns", Science, 315:487-90 (2007).
Smela, "Conjugated Polymer Actuators for Biomedical Applications", Adv. Mater., 15:481 (2003).
Tayal, et al., "Rheology and microstructural changes during enzymatic degradation of a guar-borax hydrogel", Macromolecules, 32(17):5567-74 (1999).
Yu, et al., "Photomechanics: directed bending of a polymer film by light", Nature, 425:145 (2003).

FIG. 10 A-B

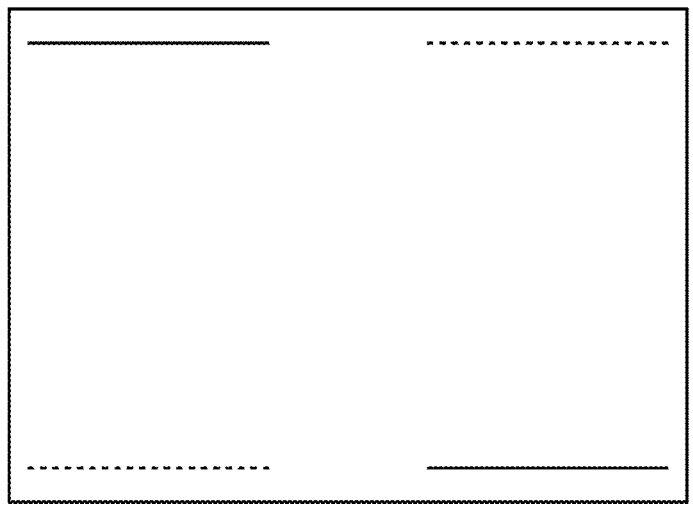
FIG. 11
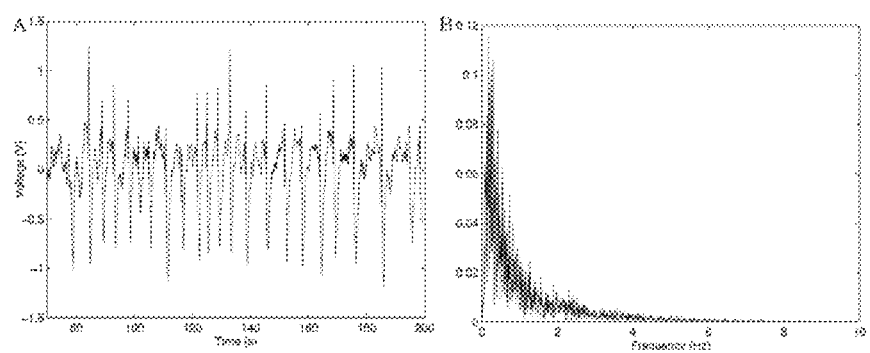
FIG. 12 A-B

POLYMER COMPOSITE ACTUATOR AND GENERATOR DRIVEN BY WATER GRADIENTS

CROSS-REFERENCE TO RELATED APPLICATIONS

This application claims priority to and benefit of U.S. Provisional Application No. 61/721,639, filed Nov. 2, 2012.

STATEMENT REGARDING FEDERALLY SPONSORED RESEARCH OR DEVELOPMENT

This invention was made with government support under Grant Nos. U54 CA151884 and HHSN268201000045C awarded by the National Institute of Health, and under Contract No. W81XWH-08-2-0034 awarded by the U.S. Army Medical Research and Material Command. The government has certain rights in the invention.

FIELD OF THE INVENTION

This invention is generally in the field of water-responsive polymeric materials.

BACKGROUND OF THE INVENTION

Polymeric materials that reversibly change shape, size, and/or mechanical properties in response to external stimuli have attracted considerable interest due to their potential applications as actuators for biomedical and mechanical purposes. Responsive polymeric materials can be divided into three classes: (1) electro-active polymers (Jager et al., *Science* 2000, 290:1540; Osada et al., *Nature* 1992, 355:242); (2) light or thermal responsive elastomers (Lendlein et al., *Science* 2002, 296:1673; Camacho-Lopez et al., *Nature Mater.* 2004, 3:307; Yu et al., *Nature* 2003, 425:145; Kim, et al., *Science* 2012, 335:1201); and (3) pH or solvent responsive gels (Sidorenko et al., *Science* 2007, 315:487; Beebe et al., *Nature* 2000, 404:588; Chen, et al., *Nature* 1995, 373:49; Caldorera-Moore et al., *Acc. Chem. Res.* 2011, 44:1061).

Many organisms use water-sorption-induced swelling for actuation (Fratzl et al., *Nature* 2009, 462:442). Several types of water-responsive hydrogels have been developed for actuator fabrication (Sidorenko et al., *Science* 2007, 315:487), but they exhibit slower response, lower stress generation and marginal stability in comparison to animal muscle fibers.

Polypyrrole (PPy) is an electro-active polymer with many desirable properties that could allow it to act as an artificial muscle (Smela, *Adv. Mater.* 2003, 15:481). PPy can also absorb water and change its shape, which is the basis for driving motion in a rotary actuator (Okuzaki et al., *J. Polym. Sci. Polym. Phys.,* 1998, 36:2237). However, the PPy rotary actuator outputs little mechanical force or power, in contrast to PPy-based electro-actuators. Okuzaki's actuator, based on a small anion-doped polypyrrole (PPy/ClO$_4$), responds due to the polypyrrole's water-sensitivity, which is mainly a physical sorption/desorption process and has a weak impact on the polymer's mechanical properties. The weak physical sorption/desorption process in Okuzaki's actuator leads to weak force generation and low water-induced stress. The maximum water-induced bending force in Okuzaki's actuator is only 4.5 times its own weight. The maximum water-induced strain of Okuzaki's actuator is 0.36%. Water sorption/desorption induced bending is slow. Therefore, the low stress generation of Okuzaki's actuator limits its potential for commercial applications.

There is a need for a water-based actuator capable of generating suitable levels of mechanical force or power for commercial applications.

It is therefore an object of the invention to provide materials capable of generating suitable levels of mechanical force in response to moisture and methods of making and using thereof.

It is further an object of the invention to provide materials capable of rapid moisture-induced actuation and methods of making and using thereof.

It is an additional object of the invention to provide devices using these materials.

It is also an object of the invention to provide methods of using these material and devices for performing work and/or power generation.

SUMMARY OF THE INVENTION

Composite materials capable of rapid water-induced actuation are provided. In some embodiments, the composite materials contain a polymeric matrix and a water-responsive gel integrated into the polymeric matrix. The composite material is capable of rapid actuation in the presence of a water gradient and can exhibit power densities greater than 1 W/kg.

In some embodiments, the polymeric matrix contains one or more conjugated polymers. The conjugated polymers can include polypyrrole and other pyrrole-containing polymers, for example, where the pyrrole can be a substituted pyrrole molecules or a mixture thereof. The polymeric materials may contain one or more dopants. Methods of forming the polymeric matrix by electropolymerization are provided.

Devices containing water-responsive composite materials are provided for sensing, locomotion, and power generation. In some embodiments the devices contain a piezoelectric material, such as polyvinylidine fluoride, coincident to the water-responsive composite material. The devices are capable of generating power greater than 1 V in the presence of a water gradient. The devices produce an electrical power density greater than 20 µW/kg.

In particular embodiments the water-responsive composite materials include polypyrrole or a pyrrole-containing polymer. The water-responsive gel is integrated within the polypyrrole or pyrrole-containing polymer matrix. The water-responsive gel can include a polyol or alkoxylated polyol crosslinked by reversibly hydrolysable bonds or functional groups, such as borate esters. In some embodiments the water-responsive gel includes an ethoxylated diol, triol, or tetrol crosslinked by reversibly hydrolysable borate esters.

BRIEF DESCRIPTION OF THE DRAWINGS

FIG. 10 B is a trace of the contraction (mm) versus time (s) curve for a PEE-PPy actuator at different loads. The loads are, from bottom to top, 0.75 MPa, 1.5 MPa, 3 MPa, 6 MPa, 9 MPa, 12 MPa, 15 MPa, 18 MPa, and 21 MPa.

FIG. 11 is a schematic of the attachment of the silver wires to the polymer-based actuator. The rectangular block represents the polymer actuator. Four short lines represents attached silver wires, two of which (solid line) are on top face of the film, and the other two wires (dashed line) are on the bottom face.

FIG. 12 A is a graph of the voltage (V) versus time (s) for the water-gradient-driven generator PEE-PPy generator. FIG. 12 B is the frequency spectrum of the signal from FIG. 12 A after Fourier transform. The maximum is around 0.3 Hz.

DETAILED DESCRIPTION OF THE INVENTION

I. Definitions

Figures 1A, 1B, 1C:
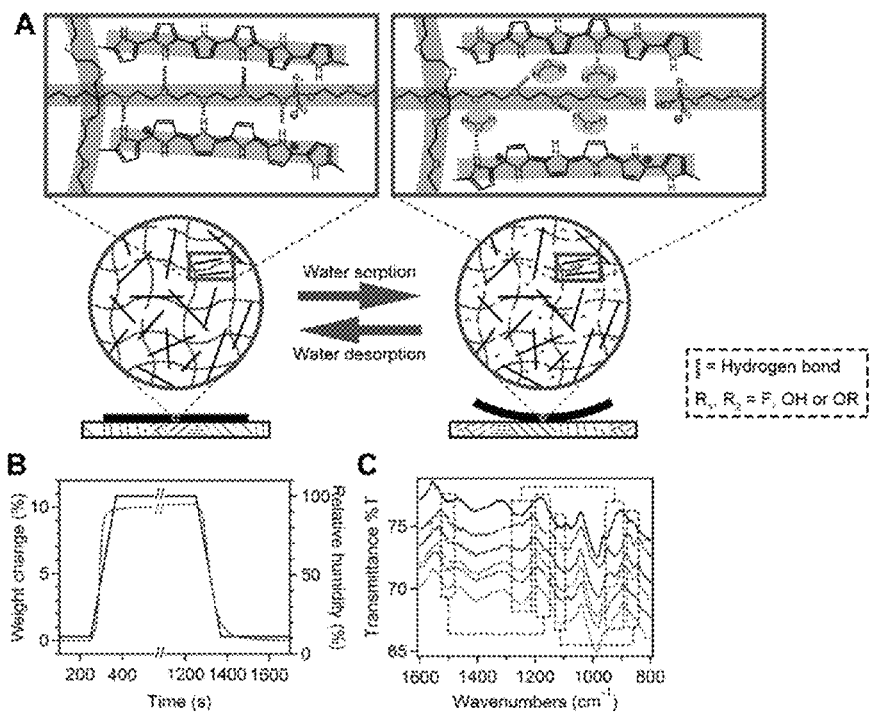
FIG. 1A is a depiction of the pentaerythritol ethoxylate (PEE)-Polypyrrole (PPY) films in the dehydrated (left) and hydrated (right) states. The structure changes in response to water sorption and desorption through the reversible hydrolysis/esterification of the borate ester bonds and the disruption of the hydrogen bonding interactions with the PPy chains.
FIG. 1B is a graph of the weight change of PEE-PPy films (left axis, % weight change) and the relative humidity of the air (% relative humidity) as a function of time.
FIG. 1C is an attenuated total reflection (ATR) IR spectra showing H/D exchange between PEE-PPy film and water vapor. From top to bottom, the spectra are: prior to D$_2$O exposure and 0, 1, 2, 3 and 4 min after D$_2$O exposure.
Figures 2A, 2B:
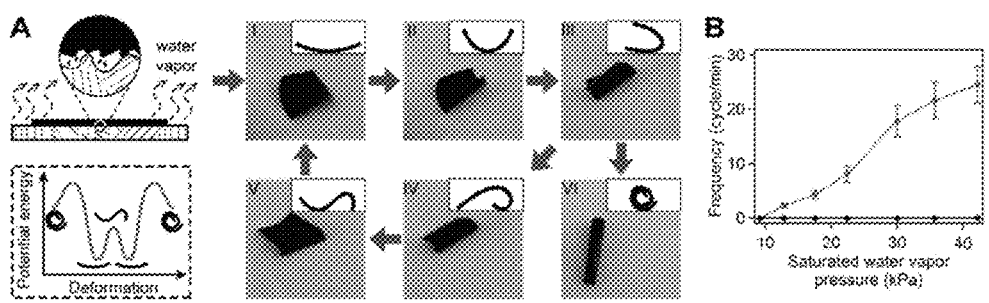
FIG. 2A is a schematic of how the elastic potential energy surface gives rise to a multi-stage locomotion in a PEE-PPy film when placed on a moist substrate. A complete flipping cycle is depicted in stages I through V and back to I.
FIG. 2B is a graph of the flipping frequency (cycles/minute) on the left axis as a function of the saturated water vapor pressure (kPa) at each substrate (N=5). A complete flipping cycle refers to the process in going from stages I through V and back to stage I as depicted in FIG. 1A.
Figures 3A, 3B, 3C, 3D:
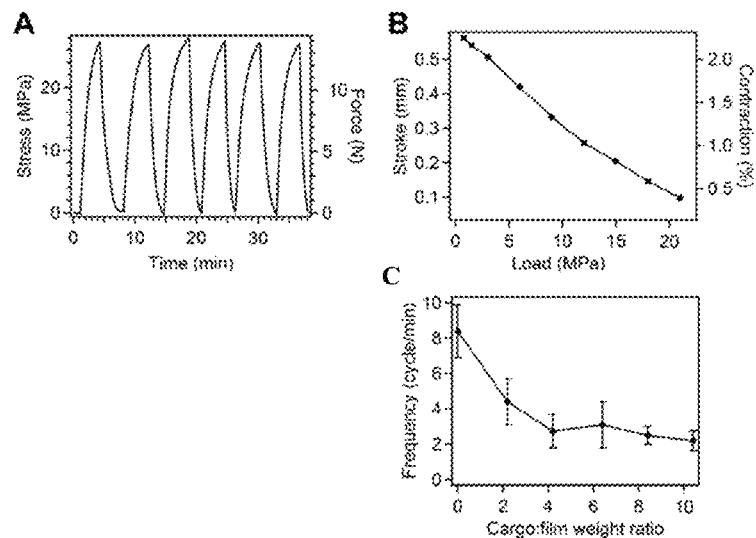
FIG. 3A is a graph of the contractile stress (MPa) and force (N) generated in a 25 MG PEE-PPy film actuator upon water sorption and desorption.
FIG. 3B is a graph of the stoke (mm) and contraction (%) as a function of the load (MPa) for a 25 MG PEE-PPy film actuator.
FIG. 3C is a graph of the flipping frequency (cycles/minute) for a 30-μm-thick PEE-PPy actuator as a function of the ratio of the cargo loading weight to the PEE-PPy film weight (w/w).
Figures 4A, 4B, 4C, 4D, 4E:
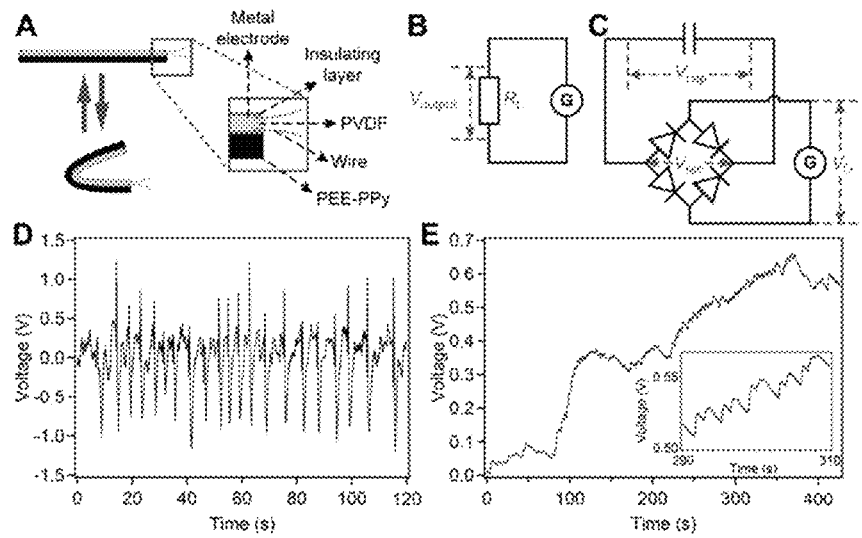
FIG. 4A is a schematic of a water-gradient-driven generator formed from a piezoelectric PVDF element with a PEE-PPy actuator.
FIG. 4B is a diagram depicting the connection of the generator (G) with a 10-MΩ resistor as load.
FIG. 4C is a diagram depicting the circuit layout for a rectifying circuit for charging a charge storage capacitor with the generator (G).
FIG. 4D is a graph of the voltage on the 10-MΩ resistor (V) as a function of time (s) for the device depicted in FIG. 4B.
FIG. 4E is a graph of the voltage across the charge storage capacitor (V) as a function of time (s) for the device depicted in FIG. 4C. The inset clearly depicts the stepwise increase in the capacitor voltage accompanying each cycle of energy conversion process.

The term "derivative", as used herein, refers to a compound or a polymer wherein one or more of the atoms or functional group has been replaced or modified. Although not necessarily the case, a derivative may be a compound or polymer that can be imagined to arise by chemical modification of the starting compound or polymer. A derivative of a polymer can include a derivative where one or more of the side functional groups is substituted with a side chains such as linear or branched alkyl or substituted alkyl groups, is substituted with an electron-donating group, or is substituted with an electron-withdrawing group. A derivative of a polymer can include substituting one atom in an aromatic ring with a heteroatom, such as substituting "CH", "N", "O", or "S".

The term "alkyl" refers to the radical of saturated aliphatic groups, including straight-chain alkyl groups, branched-chain alkyl groups, cycloalkyl (alicyclic) groups, alkyl-substituted cycloalkyl groups, and cycloalkyl-substituted alkyl groups.

In preferred embodiments, a straight chain or branched chain alkyl has 30 or fewer carbon atoms in its backbone (e.g., $C_1$-$C_{30}$ for straight chains, $C_3$-$C_{30}$ for branched chains), preferably 20 or fewer, more preferably 15 or fewer, most preferably 10 or fewer. Likewise, preferred cycloalkyls have from 3-10 carbon atoms in their ring structure, and more preferably have 5, 6 or 7 carbons in the ring structure. The term "alkyl" (or "lower alkyl") as used throughout the specification, examples, and claims is intended to include both "unsubstituted alkyls" and "substituted alkyls", the latter of which refers to alkyl moieties having one or more substituents replacing a hydrogen on one or more carbons of the hydrocarbon backbone. Such substituents include, but are not limited to, halogen, hydroxyl, carbonyl (such as a carboxyl, alkoxycarbonyl, formyl, or an acyl), thiocarbonyl (such as a thioester, a thioacetate, or a thioformate), alkoxyl, phosphoryl, phosphate, phosphonate, a hosphinate, amino, amido, amidine, imine, cyano, nitro, azido, sulfhydryl, alkylthio, sulfate, sulfonate, sulfamoyl, sulfonamido, sulfonyl, heterocyclyl, aralkyl, or an aromatic or heteroaromatic moiety.

Unless the number of carbons is otherwise specified, "lower alkyl" as used herein means an alkyl group, as defined above, but having from one to ten carbons, more preferably from one to six carbon atoms in its backbone structure. Likewise, "lower alkenyl" and "lower alkynyl" have similar chain lengths. Throughout the application, preferred alkyl groups are lower alkyls. In preferred embodiments, a substituent designated herein as alkyl is a lower alkyl.

It will be understood by those skilled in the art that the moieties substituted on the hydrocarbon chain can themselves be substituted, if appropriate. For instance, the substituents of a substituted alkyl may include halogen, hydroxy, nitro, thiols, amino, azido, imino, amido, phosphoryl (including phosphonate and phosphinate), sulfonyl (including sulfate, sulfonamido, sulfamoyl and sulfonate), and silyl groups, as well as ethers, alkylthios, carbonyls (including ketones, aldehydes, carboxylates, and esters), —$CF_3$, —CN and the like. Cycloalkyls can be substituted in the same manner.

The term "heteroalkyl", as used herein, refers to straight or branched chain, or cyclic carbon-containing radicals, or combinations thereof, containing at least one heteroatom. Suitable heteroatoms include, but are not limited to, O, N, Si, P, Se, B, and S, wherein the phosphorous and sulfur atoms are optionally oxidized, and the nitrogen heteroatom is optionally quaternized. Heteroalkyls can be substituted as defined above for alkyl groups.

The terms "alkoxyl" or "alkoxy" as used herein refers to an alkyl group, as defined above, having an oxygen radical attached thereto. Representative alkoxyl groups include methoxy, ethoxy, propyloxy, tert-butoxy and the like. An "ether" is two hydrocarbons covalently linked by an oxygen. Accordingly, the substituent of an alkyl that renders that alkyl an ether is or resembles an alkoxyl, such as can be represented by one of —O-alkyl, —O-alkenyl, and —O-alkynyl. Aroxy can be represented by —O-aryl or O-heteroaryl, wherein aryl and heteroaryl are as defined below. The alkoxy and aroxy groups can be substituted as described above for alkyl.

The terms "biocompatible" and "biologically compatible", as used interchangeably herein, refer to materials that are, with any metabolites or degradation products thereof, generally non-toxic to the recipient, and cause no significant adverse effects to the recipient. Generally speaking, biocompatible materials are materials which do not elicit a significant inflammatory or immune response when administered to a patient. In some embodiments a biocompatible material elicits no detectable change in one or more biomarkers indicative of an immune response. In some embodiments, a biocompatible material elicits no greater than a 10% change, no greater than a 20% change, or no greater than a 40% change in one or more biomarkers indicative of an immune response.

The term "coincident", as used herein, refers to the relative position of two or more objects, planes or surfaces, for example a surface that is positioned within or is adjacent to a layer, such as a functional layer, substrate layer, or other layer.

The term "elastomer", as used herein, refers to a polymeric material which can be stretched or deformed and return to its original shape without substantial permanent deformation. Elastomers commonly undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. Useful elastomers useful include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a flexible polymer is a flexible elastomer.

The term "electrical contact", as used herein, refers to the ability of two or more materials and/or structures that can transfer charge between them, such as in transferring electrons or ions. Electrical communication refers to a configuration of two or more components such that an electronic signal or charge carrier can be directly or indirectly transferred from one component to another. As used herein, electrical communication includes one way and two way electrical communications. Components in electrical communication may be in direct electrical communication, wherein an electronic signal or charge carrier is directly transferred from one component to another, or in indirect electrical communication, wherein an electronic signal or charge carrier is indirectly transferred from one component to another via one or more intermediate structures, such as circuit elements, separating the components.

"Heterocycle" or "heterocyclic", as used herein, refers to a cyclic radical attached via a ring carbon or nitrogen of a monocyclic or bicyclic ring containing 3-10 ring atoms, and preferably from 5-6 ring atoms, consisting of carbon and one to four heteroatoms each selected from the group consisting of non-peroxide oxygen, sulfur, and N(Y) wherein Y is absent or is H, O, $(C_1-C_{10})$alkyl, phenyl or benzyl, and optionally containing 1-3 double bonds and optionally substituted with one or more substituents. Examples of heterocyclic ring include, but are not limited to, benzimidazolyl, benzofuranyl, benzothiofuranyl, benzothiophenyl, benzoxazolyl, benzoxazolinyl, benzthiazolyl, benztriazolyl, benztetrazolyl, benzisoxazolyl, benzisothiazolyl, benzimidazolinyl, carbazolyl, 4aH-carbazolyl, carbolinyl, chromanyl, chromenyl, cinnolinyl, decahydroquinolinyl, 2H,6H-1,5,2-dithiazinyl, dihydrofuro[2,3-b]tetrahydrofuran, furanyl, furazanyl, imidazolidinyl, imidazolinyl, imidazolyl, 1H-indazolyl, indolenyl, indolinyl, indolizinyl, indolyl, 3H-indolyl, isatinoyl, isobenzofuranyl, isochromanyl, isoindazolyl, isoindolinyl, isoindolyl, isoquinolinyl, isothiazolyl, isoxazolyl, methylenedioxyphenyl, morpholinyl, naphthyridinyl, octahydroisoquinolinyl, oxadiazolyl, 1,2,3-oxadiazolyl, 1,2,4-oxadiazolyl, 1,2,5-oxadiazolyl, 1,3,4-oxadiazolyl, oxazolidinyl, oxazolyl, oxepanyl, oxetanyl, oxindolyl, pyrimidinyl, phenanthridinyl, phenanthrolinyl, phenazinyl, phenothiazinyl, phenoxathinyl, phenoxazinyl, phthalazinyl, piperazinyl, piperidinyl, piperidonyl, 4-piperidonyl, piperonyl, pteridinyl, purinyl, pyranyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, 2H-pyrrolyl, pyrrolyl, quinazolinyl, quinolinyl, 4H-quinolizinyl, quinoxalinyl, quinuclidinyl, tetrahydrofuranyl, tetrahydroisoquinolinyl, tetrahydropyranyl, tetrahydroquinolinyl, tetrazolyl, 6H-1,2,5-thiadiazinyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl and xanthenyl. Heterocyclic groups can optionally be substituted with one or more substituents at one or more positions as defined above for alkyl and aryl, for example, halogen, alkyl, aralkyl, alkenyl, alkynyl, cycloalkyl, hydroxyl, amino, nitro, sulfhydryl, imino, amido, phosphate, phosphonate, phosphinate, carbonyl, carboxyl, silyl, ether, alkylthio, sulfonyl, ketone, aldehyde, ester, a heterocyclyl, an aromatic or heteroaromatic moiety, —CF3, —CN, or the like.

The term "heteroatom" as used herein means an atom of any element other than carbon or hydrogen. Preferred heteroatoms are boron, nitrogen, oxygen, phosphorus, sulfur and selenium. Other heteroatoms include silicon and arsenic.

The term "stretchable", as used, refers to the ability of a material, structure, device or device component to be strained without undergoing fracture. In some embodiments, a stretchable material, structure, device or device component may undergo strain larger than 0.5% without fracturing, for some applications strain larger than 1% without fracturing and for yet other applications strain larger than 3% without fracturing. A used herein, many stretchable structures are also flexible. Some stretchable structures (e.g., device components) are engineered to undergo compression, elongation and/or twisting to be able to deform without fracturing. Stretchable structures include thin film structures comprising stretchable materials, such as elastomers; bent structures capable of elongation, compression and/or twisting motion; and structures having an island-bridge geometry. Stretchable device components include structures having stretchable interconnects, such as stretchable electrical interconnects.

The terms "modulus", "young's modulus", and "tensor modulus", as used interchangeably herein, refer to a mechanical property of a material, device or layer which refers to the ratio of stress to strain for a substance. Young's modulus may be provided by the expression;

$$E = \frac{\text{(stress)}}{\text{(strain)}} = \left(\frac{L_0}{\Delta L}\right)\left(\frac{F}{A}\right)$$

where E is Young's modulus, $L_0$ is the equilibrium length, $\Delta L$ is the length change under the applied stress, F is the force applied and A is the area over which the force is applied. Young's modulus may also be expressed from Lame constants via the equation:

$$E = \frac{\mu(3\lambda + 2\mu)}{\lambda + \mu}$$

where $\lambda$ and $\mu$ are Lame constants.

The term "tensile strength", as used herein, is defined in accordance with the pertinent art and relates to the maximum stress that a material can withstand while being stretched or pulled. Tensile strength is defined as a stress, which is measured as force per unit area. In the SI system, the unit is the Pascal (Pa) (or a multiple thereof, often megapascals (MPa) or gigapascals (GPa), using the mega-prefix); or, equivalently to Pascals, Newtons per square meter ($N/m^2$).

The term "environmentally stable", as used herein, refers to the ability of a material to retain macroscopic physical characteristics over time at ambient conditions of pressure, temperature, and humidity. The macroscopic physical characteristics can include, but are not limited to, tensile strength, tensile modulus, actuation rate, or electrical conductivity.

The term "integrated", as used herein, refers to a water-responsive gel that is intimately mixed within the polymeric matrix such that the composite material retains an actuation rate in the presence of water that is greater than 0.01 $cm^2/s$.

The term "interpenetrated", as used herein, refers to a water-responsive gel that is intimately mixed throughout at least a portion of the polymeric matrix such that they form an single polymeric phase.

II. Water-Responsive Composite Materials

Water responsive composite materials can be biocompatible and/or environmentally stable. The water-responsive composite materials can be environmentally stable for a period greater than 3 months, greater than 6 months, or greater than 1 year. The water-responsive composite materials are capable of absorbing up to 5%, 10%, 12%, 15%, 18%, 20%, or 30% water by weight. The response of the water-responsive composite material is completely reversible or almost completely reversible, i.e. upon water sorption and desorption the material is capable of returning to within 5%, 10%, or 15% of the dry weight, size, and/or shape. In some embodiments the water-responsive composite material is capable of maintaining at least 70%, 80%, 90%, 95%, or 99% of initial performance (actuation rate, power generation, stress generation, contractile force generation, flexibility, work output, etc.) through at least 100, 200, 400, 600, 1,000, or 5,000 sorption/desorption cycles.

The water-responsive composite materials can exhibit rapid moisture-induced actuation. The response of the water-responsive composite material can be instantaneous or almost instantaneous, i.e. within 1 s, 100 ms, 10 ms, 1 ms, or 0.1 ms of a change in the humidity. The actuation rate of the water-responsive composite material can be as fast as 0.01 $cm^2/s$, 0.05 $cm^2/s$, 0.1 $cm^2/s$, 0.2 $cm^2/s$, 0.3 $cm^2/s$, 0.4 $cm^2/s$, or 0.5 $cm^2/s$.

The water responsive composite materials can have high electrical conductivity. The electrical conductivity can be greater than 5 S/cm, 10 S/cm, 15 S/cm, 20 S/cm, 25 S/cm, or 30 S/cm. When the composite material contains a conjugated polymer, the composite material can retain a conductivity that is at least 80%, 90%, 95%, or 99% as high as the conductivity of the conjugated polymer alone when measured under the same conditions.

The water-responsive composite material can be stretchable. For example, the water-responsive composite material can be stretched by more than 5%, 10%, 15%, 20%, 25%, or 30% without breaking. The water-responsive composite material can rapidly switch between a dry/rigid state and a moist/soft state. For example, the dry state may have a tensile modulus of greater than 1 GPa, 1.5 GPa, 2 GPa, 2.5 GPa, or 3 GPa. The moist state may have a tensile modulus of greater than 0.5 GPa, 0.6 GPa, 0.8 GPa, 1.0 GPa, or 1.5 GPa.

The water-responsive composite materials are capable of working as a water-responsive actuator in response to water or a water gradient. The water-responsive composite materials can exhibit a power density greater than 1.0 W/kg, 1.5 W/kg, 2.0 W/kg, 2.5 W/kg. or 3.0 W/kg. The water-responsive composite materials can exhibit a power density of 0.5-10.0 W/kg, 0.5-5.0 W/kg, 0.8-4.0 W/kg, or 1.0-3.0 W/kg.

A. Polymeric Matrix

The water-responsive composite material contains a polymeric matrix. The polymeric matrix provides structural support to the composite material.

The polymeric matrix can contain one or more conjugated polymers. Conjugated polymers can include, but are not limited to, polythiophene, polypyrrole, poly(3,4-ethylenedioxythiophene) (PEDOT), polyfuran, polyselenophene, polyaniline, polyphenylene, polyphenylene vinylene, polyfluorene, polycarbazole, polyindole, polythiazole, polyacetylene, derivatives thereof, and copolymers thereof.

In some embodiments, the polymeric matrix contains one or more pyrrole-containing polymers. Pyrrole-containing polymers, as used broadly herein, refer to any polymer containing a 5-membered heterocyclic aromatic ring having at least one NH group. Pyrrole-containing polymers can include polypyrrole, poly(pyrazole), poly(triazole), poly(dithienopyrrole), poly(dithienopyrrolidone), poly(benzodipyrrole), poly(benzodipyrrolidone), poly(indole), poly(carbazole), poly(purine), poly(imidazole), poly(indazole), poly(benzimidazole), poly(benzotriazole), derivatives thereof, and copolymers thereof. In some embodiments the polymeric matrix contains polypyrrole or a polypyrrole derivative.

The polymeric matrix may include one or more elastomers or elastomeric polymers. Elastomeric polymers include, but are not limited to, thermoplastic polyurethanes, poly(etheramide) block copolymers, thermoplastic rubbers such as uncrosslinked polyolefins, styrene-butadiene copolymers, silicon rubbers, synthetic rubbers such as nitrile rubber, styrene isoprene copolymers, styrene ethylene butylene copolymers, butyl rubber, nylon copolymers, ethylene-vinyl acetate copolymer or mixtures thereof.

In some embodiments the polymeric matrix contains polymers having hydrogen bond donating groups such as hydrogen atoms bonded directly to O, N, or S.

B. Water-Responsive Gel

The water-responsive composite material also contains a water-responsive gel. The water-responsive gel can be integrated within the polymeric matrix, interpenetrated within the polymeric matrix, or both. In some embodiments the water-responsive gel includes hydrogen bond acceptor groups. In some embodiments the water-responsive gel is covalently bonded to one or more polymers in the polymeric matrix. For example, in some embodiments the water-responsive gel is non-covalently bonded to a polymer in the polymeric matrix by hydrogen bonding interaction. The hydrogen bonding interactions can occur between the hydrogen bond donating groups in a polymer of the polymeric matrix and the hydrogen bond acceptor groups of the water-responsive gel.

The water-responsive gel may be present in any amount from 1% to 99% by weight of the composite material. In some embodiments the water-responsive composite material contains from 5% to 25%, from 8% to 20%, or from 10% to 15% of the water-responsive gel by weight.

The water-responsive gel can contain one or more reversibly hydrolysable bonds. In some embodiments, the water-responsive gel contains a reversibly hydrolyzable ester group. Exemplary reversibly hydrolyzable ester groups include, but are not limited to, borate ester, sulfate ester, or a phosphate ester. The water-responsive gel may include a siloxane.

The water-responsive gel can contain a polyol, an ester of a polyol, or an ester of an alkoxylated polyol. The polyol can have two (diol), three (triol), four (tetrol), or more alcohol groups. The polyol can contain methanol, ethanol, propanol, isopropanol, butanol, isobutanol, pentanol, propenol, propynol, butane diol, butenediol, butynediol, glycerol, ethylene glycol, diethylene glycol, methylene glycol, propanediol, dipropylene glycol, polyethylene glycol, polypropylene glycol, trimethylol propane, pentaerythritol, caprolactone polyols, carbonate polyols, ethanolamine, diethanolamine, triethanolamine, tetra(2-hydroxypropyl)ethylenediamine, sorbitol, or simple and/or complex sugars. The polyol can be a sugar alcohol such as maltitol, sorbitol, xylitol, erythritol, and isomalt. The polyol can be glycerin, pentaerythritol, ethylene glycol, or sucrose groups.

In some embodiments the water-responsive gel can contain an alkoxylated polyol or an ester of an alkoxylated polyol, including but not limited to ethoxylated polyols, propoxylated polyols, butoxylated polyols, combinations thereof, and esters thereof. The alkoxylated polyol can contain one of the polyols described above alkoxylated with from 1 to 10 alkoxy groups per alcohol group. The alkoxylated polyol can have an average of 2, 3, 4, 5, 6, or more alkoxy groups per alcohol group. The alkoxylated polyol can be glycerol, trimethylolethane, trimethylolpropane, benzenetriol, cyclohexanetriol, erythritol, pentaerythritol, sorbitol, mannitol, sorbitan, dipentaerythritol or tripentaerythritol alkoxylated with from 1 to 10 alkoxy groups per alcohol group. The alkoxylated polyol can have a number average molecular weight of 100 g/mol to 10,0000 g/mol, 100 g/mol to 1,000 g/mol, 200 g/mol to 1,000 g/mol, 300 g/mol to 1,000 g/mol, 300 g/mol to 900 g/mol, 400 g/mol to 800 g/mol, or 500 g/mol to 800 g/mol.

The water-responsive gel can contain an ester of an ethoxylated polyol. For example, the water-responsive gel can contain a borate ester of an ethoxylated polyol, a sulfate ester of an ethoxylated polyol, or a phosphate ester of an ethoxylated polyol. The ethoxylated polyol can be pentaerythritol ethoxylate or an ethoxylate of a pentaerythritol derivative, such as those described in U.S. Pat. No. 8,501,807.

In some embodiments, the polyol or alkoxylated polyol can have a number average molecular weight of 200 to 5,000 grams/mole, or 200 to 4,000 grams/mole, or at least 200 grams/mole, or at least 400 grams/mole, or at least 1000 grams/mole, or at least 2000 grams/mole. In some embodiments, the polyol or alkoxylated polyol can have a number average molecular weight of less than 5,000 grams/mole, or less than 4,000 grams/mole, or less than 3,000 grams/mole, or less than 2,000 grams/mole, or less than 1,000 grams/mole, or less than 500 grams/mole.

C. Dopants

The polymeric matrix may be a doped polymeric matrix, i.e. can contain one or more dopants. Conjugated polymers, especially those that exhibit an intrinsic conductivity, can be rendered more highly conductive by full or partial charge transfer with a dopant that is an acid or redox agent. Dopants used for doping conjugated polymers may include those described in U.S. Pat. No. 6,203,727.

Acid dopants may include dodecylbenzenesulfonic acid, toluenesulfonic acid, hydroxybenzenesulfonic acid (HBSA), hydrogen chloride, sulfuric acid, nitric acid, $HClO_4$, $HBF_4$, $HPF_6$, HF, phosphoric acids, picric acid, m-nitrobenzoic acids, dichloroacetic acid, selenic acid, boronic acid, organic sulfonic acids, and inorganic clusters of polyoxometallates.

The dopant may be a polymeric dopant such as polymers having terminal or pendant carbon-, phosphorous-, or sulfur-containing acid groups, and salts and esters thereof, or mixtures thereof. The polymeric dopant may include those described in U.S. Pat. No. 5,378,402. Specific examples include ethylene/acrylic acid copolymers, polyacrylic acids, ethylene/methacrylic acid copolymers, carboxylic acid- or sulfonic acid-functional polystyrene, polyalkylene oxides, and polyesters; and graft copolymers of polyethylene or polypropylene and acrylic acid or maleic anhydride as well as mixtures thereof sulfonated polycarbonates, sulfonated ethylene-propylene-diene terpolymers (EPDM), sulfonated ethylene-styrene copolymers, polyvinylsulfonic acid, sulfonated poly(phenylene oxide), and sulfonated polyesters such as polyethylene terephthalate; as well as the certain alkali metal and transition metal salts of such acids, preferably the lithium, manganese, and zinc salts of such acids.

The dopant may be a redox dopant. Redox dopants are generally classified as n-type dopants/reducing agents or p-type dopants/oxidizing agents. The p-type dopant can be a molybdenum complex, such as molybdenum dithiolene complex (Mo(tfd)3). The n-type dopant may be a cobaltocene $(Co(C_5H_5)_2)$ or decamethylcobaltocene $(Co(C_5Me_5)_2)$. The redox dopant may include those described in U.S. Patent Application Publication No. 2011/0266529. Redox dopants may include metal-tetracyanoquinodimethane (TCNQ) salts, metal-tetracyanonaphthoquinodimethane (TNAP) salts, metal-tetracyanoethylene (TCNE) salts, dichlorodicyanobenzoquine (DDQ) salts and similar metallorganic semiconductor salts. Metals useful in redox dopants may include copper, silver, platinum, palladium, nickel, cobalt, zinc, cadmium, iridium, osmium, or rhodium.

The dopant may be present in any amount necessary to achieve the desired level of conductivity. The dopant will typically be present in an amount less than about 50% by weight, more typically 1% to 20%, 1% to 15%, 2% to 10%, or 2% to 5%.

III. Methods of Making Water-Responsive Composite Materials

The water-responsive composite material may be made by any method known to those skilled in the art. In some embodiments, the polymerization of the polymers in the polymeric matrix and the crosslinking of the water-responsive gel is performed simultaneously. For example, a mixture containing precursors of the polymer, the polyol, and a precursor for esterification of the polyol can be reacted to simultaneously form the polymeric matrix with the water-responsive gel interpenetrated therein.

The polymer precursors can be made or, in many cases, may be purchased. The polymer precursors can include pyrrole or substituted pyrroles. Methods of making substituted pyrroles are known in the art (for example see Ngwerume et al., *J. Org. Chem.*, 2010, 75:6271-6274).

In preferred embodiments the polymeric matrix is synthesized by electropolymerization. Electropolymerization refers to the electrolysis of a monomer or a mixture of monomers dissolved in an electrolytic solution, followed by anodic polymerization of the monomers oxidized by the anions in the dissolved electrolyte. The polymers obtained are preferably conductive and may also be oxidized and doped with the anions of the electrolyte. The polymer can thus be controllably grown on the anode surface, allowing for a controllable film thickness. In preferred embodiments the polymeric matrix is formed by electropolymerization of pyrrole and/or substituted pyrroles. Methods of electropolymerization are described, for example, in U.S. Pat. No. 5,130,054, European Patent No. EP 0229993, and in Trofimov et al., *Eur. J. Org. Chem.*, 2005, 20: 4338-4345.

Platinum is one of the most active electrode materials for synthesis of polypyrrole, but it is expensive and relatively soft. The size of obtained PPy film may be restricted by the availability of large platinum electrodes. Ultrathin (25 nm) platinum-coated glass slides have a mirror-like surface and work as well as platinum foil electrode. This low-cost disposable platinum electrode renders the high quality, reproducible films of conjugated polymers, for example PPy. It is also convenient for producing large PPy films.

In preferred embodiments the water-responsive composite material is formed by electropolymerization with the water-responsive gel precursor. For example, the electropolymerization of the polymeric matrix can be done in the presence of a polyol or alkoxylated polyol and boron trifluoride diethyl etherate. This results in the polyol or alkoxylated polyol crosslinked by reversibly hydrolysable borate ester groups interpenetrating the polymeric matrix.

IV. Methods of Using Water-Responsive Composite Materials

Water-responsive composite materials can be used as actuators in a variety of devices. For example, water-responsive composite materials can be combined with other materials for sensing applications or for power generation. In some embodiments the water-responsive composite material can be used in a device for transporting a load.

In some embodiments, a device is provided containing a water-responsive composite material and a piezoelectric material. The piezoelectric material may be placed coincident to the water-responsive composite material or may be integrated into the water-responsive composite material. In some embodiments the piezoelectric material is a piezoelectric polymer integrated into the polymeric matrix. The piezoelectric materials can convert the motion of the water-responsive composite material into an electrical current. Piezoelectric materials can include piezoelectric crystals such as gallium phosphate, quartz, and tourmaline, or thin films or nanoparticles made from piezoelectric ceramics such as barium titanate, lead zirconate, lead titanate, and/or lead zirconate titanate or organic piezoelectric materials such as polyvinylidene fluoride.

The piezoelectric material can be positioned within the polymeric matrix, can be positioned coincident to the water-responsive composite material, or can be positioned coincident to one or more layers that are coincident to the water-responsive composite material in a multi-layer device structure. The piezoelectric material should be positioned such that the motion of the water-responsive composite material, results in the generation of an electric current. In some embodiments the electric current is provided directly to one or more integrated electronic components in electrical contact with the piezoelectric material or optionally is used to charge a battery or a capacitor in electrical contact with the piezoelectric material, generally through a wire such as a silver wire. In some embodiments the device generates a peak voltage greater than 0.5 V, greater than 1.0 V, greater than 2.0 V, or greater than 5.0 V. In some embodiments the device produces an average electrical power density of at least 20 µW/kg, at least 30 µW/kg, at least 40 µW/kg, at least 50 µW/kg, or at least 60 µW/kg.

The present invention will be further understood by reference to the following non-limiting examples.

EXAMPLES

Chemicals and Materials

All chemicals were purchased from Sigma-Aldrich. Pyrrole and boron trifluoride diethyl etherate (BFEE) were distilled under reduced pressure prior to use. All the other chemicals were used without further purification. Microscopy glass slides (2.5 cm×7.5 cm) were purchased from VWR and washed by acetone, isopropanol and water, then dried at 70° C. A 10-nm Ti layer and then a 25-nm Pt layer were deposited onto the glass slides by vacuum sputtering. Bare silver wire (0.38 mm diameter) and insulated multistrand stainless steel wires (total diameter 0.14 mm) were purchased from A-M Systems. Bare silver wire was cut into approximately 1-cm long pieces, which was about 12 mg each. TX612 Techni-Cloth nonwoven wipers were purchased from VWR and used as paper substrate for actuation. 9-µm-thick bi-axially stretched poled and unmetallized piezoelectric polyvinylidene difluoride (PVDF) film was purchased from Precision Acoustics in UK.

Example 1

Electrochemical Synthesis of Polypyrrole Composite Films

Figure 5A:
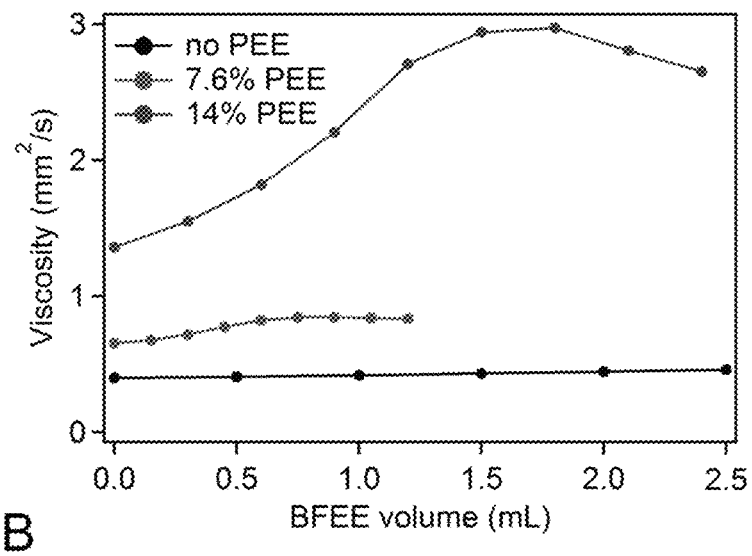
FIG. 5A is a graph of the viscosity of $CHCl_3$ solutions ($mm^2/s$) containing from bottom to top no PEE, 7.6% PEE, and 14% PEE as a function of the volume of added BFEE (mL).
Figure 5B:
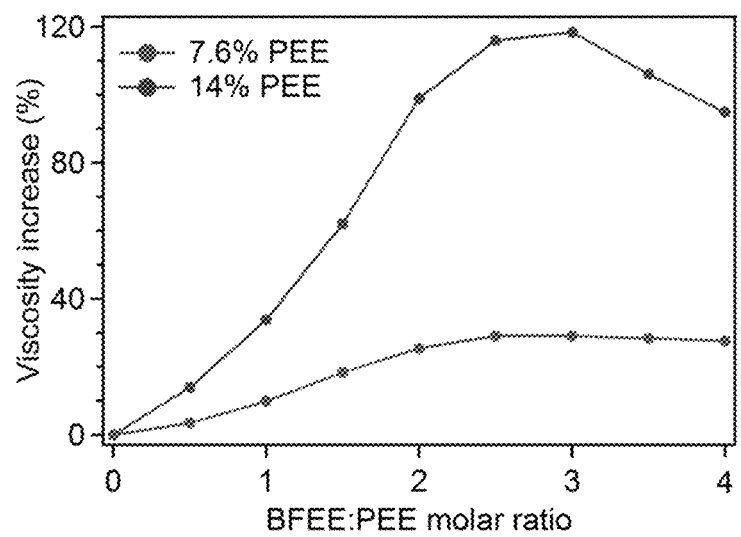
FIG. 5B is a graph of the increase in viscosity of $CHCl_3$ solutions (% increase) containing from bottom to top 7.6% PEE and 14% PEE as a function of the ratio of added BFEE to PEE (mole/mole).

The free-standing composite polymer film was synthesized by electro-polymerization of pyrrole in the presence of a polyol-borate complex. The polyol was pentaerythritol ethoxylate (PEE), a four-armed ethylene glycol oligomer (MW approximately 800), which can coordinated with boron (III) species to form a dynamic polymer network as indicated by peak shifts in $^{11}$B NMR spectra and increased viscosity (FIGS. 5A and 5B). The anionic PEE-borate complex was electrically attracted to the cathode and trapped in the growing PPy matrix as macromolecular counter ions.

Electrochemical synthesis was performed in a one-compartment cell having a Pt-coated glass electrode (2.5 cm×4 cm) as the working electrode, a 5 cm×5 cm platinum foil as the counter electrode, and a 2.0 mm diameter Ag/AgCl wire (immersed directly in the solution) as the quasi-reference.

The experiments were controlled using a model 263A potentiostat-galvanostat (EG&G Princeton Applied Research). The typical electrolyte was 0.05 M pyrrole in a mixture of isopropyl alcohol, boron trifluoride diethyl etherate at a volume ratio of 7:3, with or without the 0.07 M pentaerythritol ethoxylate (15/4 EO/OH) (PEE). The solution was degassed on a rotavap at 15 kPa for 3 min. The electro-polymerization was carried out at a constant current density of 0.8-1 $mA/cm^2$ at 0° C.

After synthesis, the working electrode was rinsed by isopropanol. Then the polymer film was readily peeled off the electrode, washed by isopropanol and water, and left in ambient air overnight. The obtained films were referred to as PEE-PPy (with PEE in composition) or PPy (without PEE in composition), respectively. For long-term stability test, the PEE-PPy film was stored in ambient air on a lab bench without exposure to direct sunlight.

Example 2

NMR and Kinematic Viscosity Study of PEE-BF3 Network in Chloroform

Chloroform was used as the solvent for both NMR and viscosity studies of PEE-$BF_3$ network, because the density (1.492 g/mL) and polarity (dielectric constant is 4.81) of chloroform are close to that of PPy (density is 1.5 g/mL, and dielectric constant of pyrrole monomer is 7.5). The dielectric constant for PPy is close to pyrrole monomer. The $^{11}$B NMR spectra were recorded on a Bruker 400 MHz NMR. 25 μL BFEE with or without 0.1 g PEE was dissolved in 0.5 mL $CDCl_3$. Without PEE, the $^{11}$B signal of BFEE in $CHCl_3$ was a sharp peak at −19.3 ppm. With PEE, the −19.3 ppm peak disappeared and two new peaks at −20.1 and −20.6 ppm appeared. The −20.1 ppm was very broad, indicating the boron species was covalently attached to a macromolecule. The −20.6 ppm peak was still sharp, which could be remaining BFEE or other small-molecular boron species, such as $BF_4^-$.

The following equation shows a chemical reaction to form the PEE-borate network, where R—OH represents one arm of PEE.

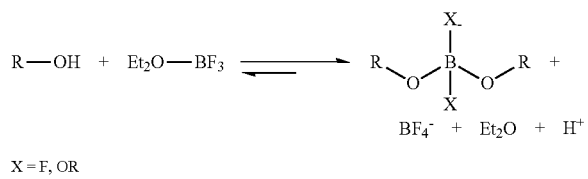

X = F, OR

For the kinematic viscosity study, 0 g, 2 g or 4 g pentaerythritol ethoxylate (15/4 EO/OH) (PEE) was dissolved in appropriate amount of chloroform to the final volume of 18 mL, where the PEE in the solution was 0%, 7.6% and 14% by mass, respectively. A certain amount (0-2.5 mL) of boron trifluoride diethyl etherate (BFEE) was added into the chloroform solutions using a 0.5-mL glass syringe and gently mixed by hand shaking. The kinematic viscosity was measured three times using a ubbelohde viscometer (Calibrated, Technical Glass Products, Model Ubb-1, constant is 0.00929 cSt/s) and averaged for each data point (FIG. 5A). All the measurements were conducted at constant room temperature (24° C.).

When there was no PEE in the chloroform solution, adding BFEE only slightly changed the viscosity. But with 7.6% or 14% PEE in the chloroform solution, adding BFEE significantly increased the solution viscosity, which reached maximum at BFEE/PEE molar ratio around 2:1. Adding more BFEE actually decreased the viscosity, which indicated that excess BFEE did not help the formation of the PEE-borate network, but diluted the solution. Since each PEE molecule contains 4 hydroxyl groups (—OH), the boron:OH ratio at maximum viscosity was 1:2, which confirmed the model (see chemical equation above) that the inter-molecular borate ester served as a bridge between two PEE arms to form the PEE-borate network. Intra-molecular borate ester between two arms of the same PEE molecule was possible, especially when the PEE concentration was low, e.g. 7.6%. When PEE concentration was higher, the viscosity increased much more (FIG. 5B) upon reaction with BFEE.

As a control, the kinematic viscosity of 14% linear PEG (MW approximately 2000) in chloroform by mass was 2.41 $mm^2/s$, which was significantly smaller than the value (2.96 $mm^2/s$) for 14% PEE sample at PEE/BFEE molar ratio 1:2. This data demonstrates that PEE molecules (MW approximately 800) were cross-linked by borate linkage to form oligomers (MW>2000). The typical mass percentage of water-extractable PEE in PEE-PPy film was 12%, which was close to the 14% PEE-borate sample in chloroform. So the PEE-borate exists as a dynamic network in the PEE-PPy film.

Example 3

Electrochemical Reduction and Water Soaking of PPy Films

Electrochemical reduction of PEE-PPy and PPy films were performed using the same setup for electropolymerization, by replacing the Pt-coated glass slide by PEE-PPy or PPy films as the working electrode. The electrolyte was isopropyl alcohol solution containing 0.05 M tetrabutylammonium tetrafluoroborate as the supporting electrolyte. The reduction was carried out at a constant potential of −1.0 V at room temperature. After 1 hour, the PEE-PPy or PPy films were rinsed by isopropanol and water, and dried in ambient air for overnight before test. PEE-PPy or PPy films were soaked in 90° C. $H_2O$ for 1 hour. Then the films were rinsed by water and dried in ambient air overnight before testing.

The PPy samples after reduction or hot water soaking were too brittle for reproducible mechanical tests. The PEE-PPy samples exhibited good conductivity after either reduction or water soaking But the water-soaked PEE-PPy sample showed much less tensile strength and elongation, as well as conductivity, comparing to the initial PEE-PPy sample or the sample after reduction. This suggested the key role of PEE-borate network for the integrity and flexibility of the PEE-PPy composite film.

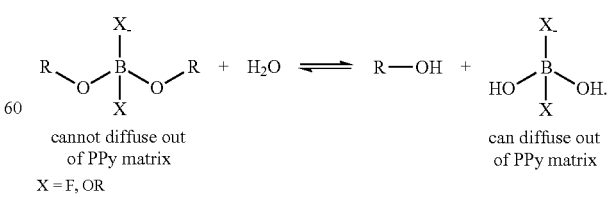

cannot diffuse out of PPy matrix

X = F, OR can diffuse out of PPy matrix

The water sample after soaking 72.34 mg PEE-PPy films (multiple films were cut into small pieces and soaked in 20 mL water) was frozen and lyophilized. The remaining sticky solid was extracted by sonication in 0.6 mL $CDCl_3$. 100 μL $CDCl_3$ containing 100 mM benzene (10 μmol) was added. The benzene was used as an internal reference for the measurement of the PEE amount. Typical molecular formula of PEE is $C_5H_{12}O_4(C_2H_4O)_{15}=C_{35}H_{72}O_{19}$, MW=796. The weight % extractable PEE in the PEE-PPy film was 11.9%

The remaining white solid after lyophilization was also measured using ATR-IR (FIG. S5). PEE and boric acid were measured on ATR-IR as standard. The IR spectrum of lyophilized sample matched well with the PEE and boric acid spectrum, while some peaks on the PEE-PPy spectrum could be attributed to PEE and borate.

Example 4

IR and Raman Spectrum Analysis

Figure 8:
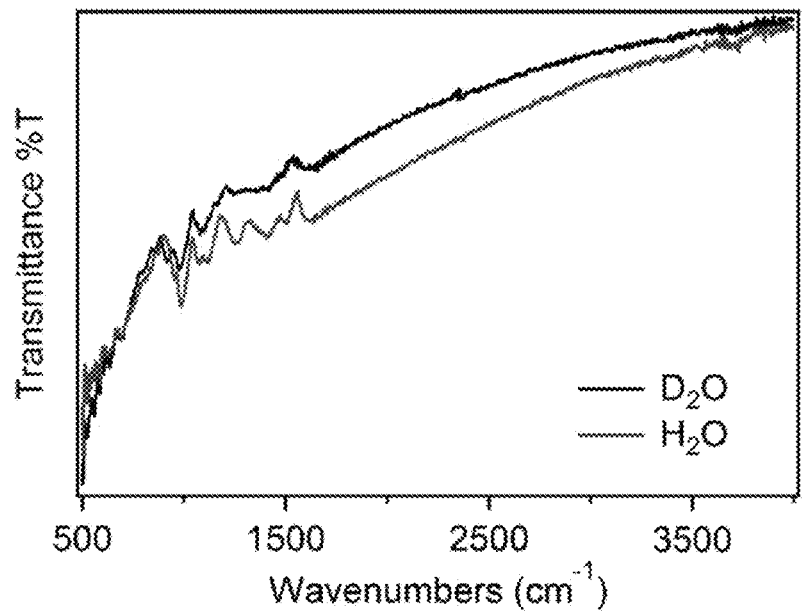
FIG. 8 is a graph of the attenuated total reflection (ATR)-IR spectra of PEE-PPy film before and after $D_2O$ treatment.

Infrared spectra were recorded on a Bruker alpha-E with ATR eco ZnSe sensor. The PPy film samples were firmly pressed on the ZnSe sensor and the ATR IR spectra were recorded (FIG. 8) at room temperature 24° C. with relative humidity 20%. For the hydrogen-deuterium exchange experiment, the PEE-PPy sample size was just enough to cover the whole ZnSe sensor. After saturation in $D_2O$ for 10 seconds, the sample was taken out of $D_2O$ and quickly wiped with tissue paper to make sure no $D_2O$ drops remained on the sample surface. The first IR spectrum was recorded (t=0). The sample was then held in air by tweezers and its IR spectrum was recorded every one minute. Each IR measurement took about 10 s.

Raman spectra were recorded on Kaiser Optical Raman Microscope employing a 785 nm laser beam and a CCD detector with 4 cm-1 resolution. The optical microscopy image of a 6-month-old PEE-PPy film was recorded using a 10× objective on this microscope. The film surface was tight and flat, with a few dents and scratches. The scale bar was 100 micrometer. The red cycle indicated a typical area for Raman spectroscopy. The Raman spectra were recorded by using a 10× objective at a low power (0.5 mW) and accumulated three times for 30 s each. Raman interrogation of the film showed a typical spectrum for PPy in its oxidation state (32). There was little change in the PEE-PPy film Raman spectra with or without liquid water at the sample area (FIG. S16), which suggested that the PPy skeleton changed little upon water sorption and desorption.

Example 5

Conductivity Measurement

The electrical conductivity of dried PPy composite films were measured by using standard four-point method, yielding a value approximately 30 S/cm at room temperature, which is typical for electro-polymerized PPy samples.

Example 6

Mechanical Property Analysis

Mechanical property analysis was performed on an Instron 5943 mechanical testing machine. All tests were carried out at room temperature (24° C.) and relative humidity 20%, with no detectable air flow.

Figure 6:
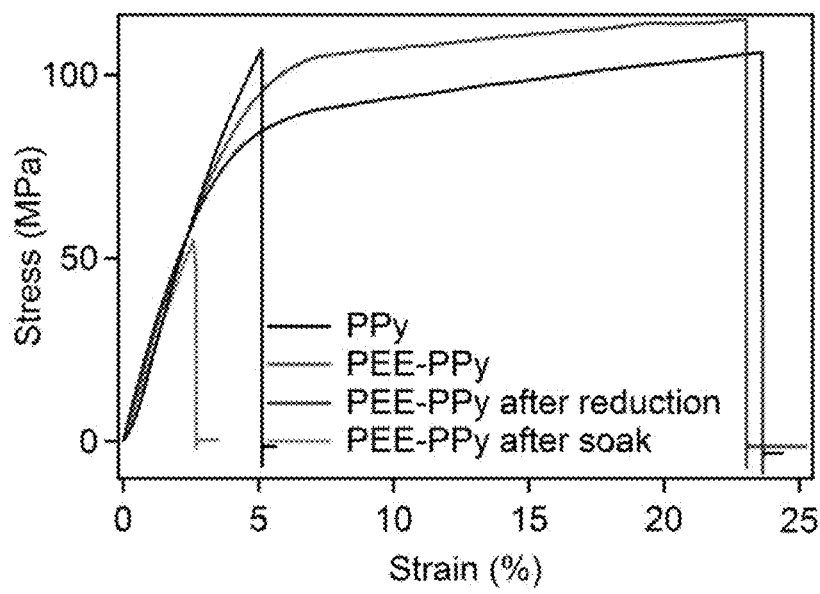
FIG. 6 is a graph of the stress (MPa) for dry PPy films, dry PEE-PPy films, dry PEE-PPy films after electrochemical reduction, and dry PEE-PPy films after soaking for 1 hour in 90° C. $H_2O$ as a function of the strain (%).
Figure 7:
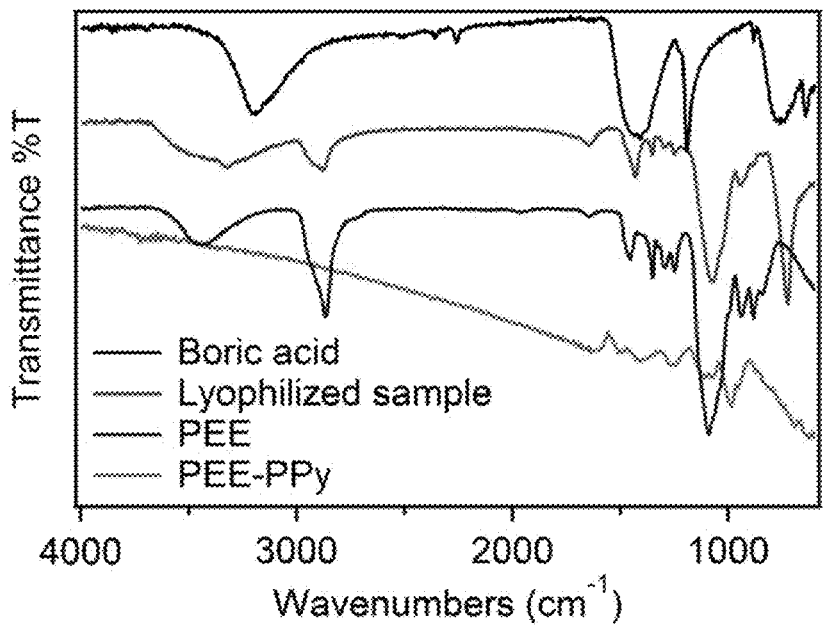
FIG. 7 is a graph of the attenuated total reflection (ATR)-IR spectra of, from top to bottom, boric acid, lyophilized soaking water sample, PEE, and PEE-PPy films.
Figure 9:
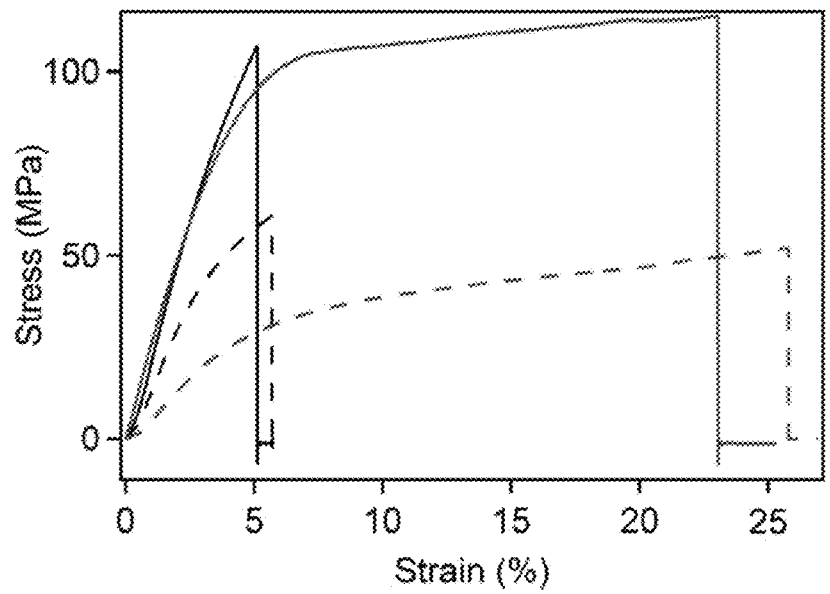
FIG. 9 is a graph of a typical stress (MPa) versus strain (%) curve for dry (solid) and moist (dashed) PEE-PPy and PPy films.
Figure 10:
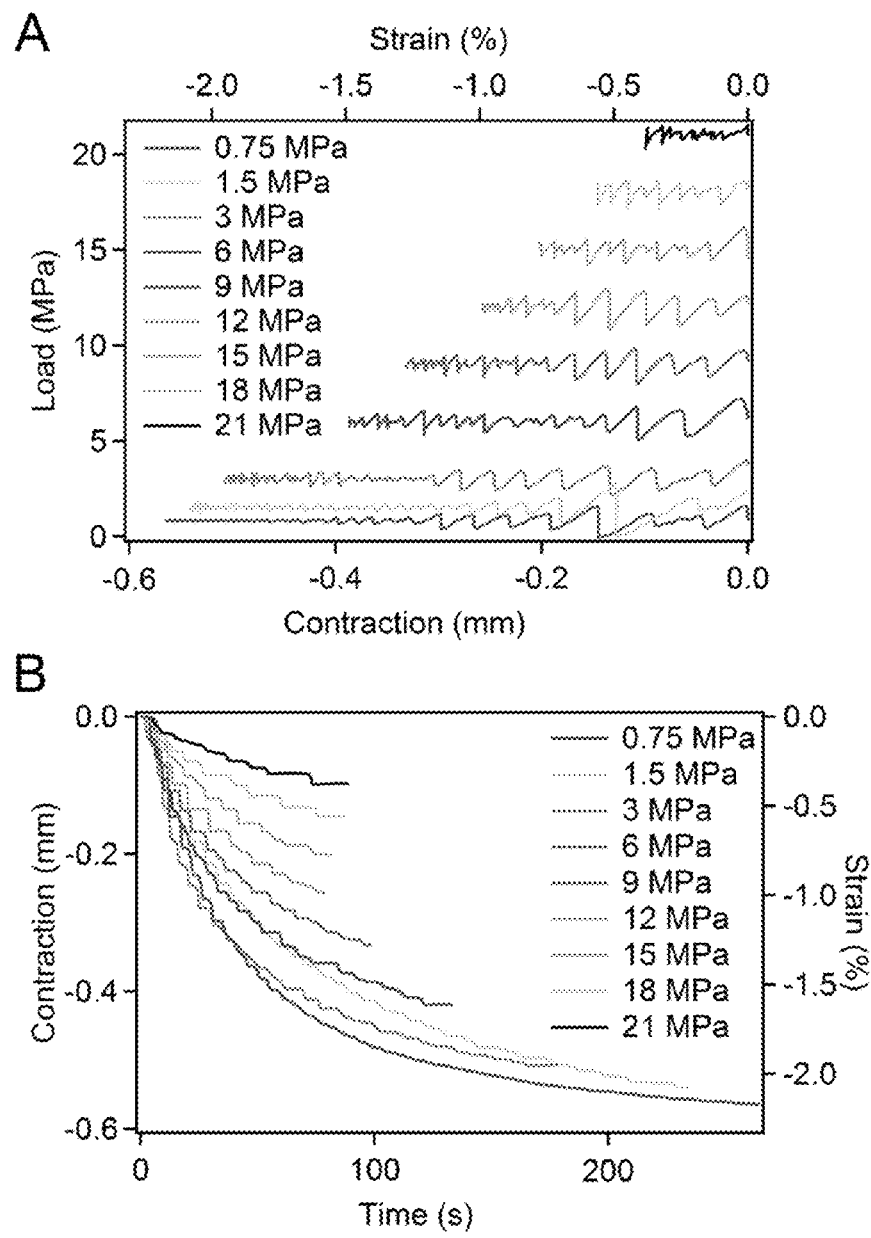
FIG. 10 A is a trace of the load dependent contraction of a PEE-PPy actuator at different loads. The loads are, from bottom to top, 0.75 MPa, 1.5 MPa, 3 MPa, 6 MPa, 9 MPa, 12 MPa, 15 MPa, 18 MPa, and 21 MPa.

For tensile stress test, the typical sample size was 0.4 cm wide, 2 cm long and 20-30 μm thick. The elongation rate was 2 mm per minute. For measurements of water saturated films, the films were first loaded between the two clamps, and then completely and gently wrapped by a piece of moist Kimwipes paper (approximately 0.6 g). The Kimwipes paper didn't touch the clamps. The tensile strength of a dry PEE-PPy film was approximately 115 MPa, indicating that this polymeric material was stronger than most engineering plastics and comparable to some metal materials such as aluminum. In addition, this strong PEE-PPy film was stretchable (23% elongation at break, and tensile modulus of 2.3 GPa) with a smooth elastic-plastic transition at approximately 5% strain, while a PPy film without PEE-borate network broke at approximately 5% strain (FIG. 6 and FIG. 9). This data indicated that the PEE-borate network that crosslinks the rigid PPy matrix served as a macromolecular plasticizer, which significantly enhanced the durability of the composite.

The desorption of water from a PEE-PPy film caused shrinkage of the film and generated a significant internal stress. A PEE-PPy film (25 mg, 17 mm×30 mm×30 μm) was fixed between two clamps and covered by a piece of moist Kimwipes paper (approximately 0.6 g). The initial film length between two clamps was 26 mm. The film was slowly elongated approximately 2.5% to match its swelling. At this point, only a 0.05 N force was loaded on the film to keep it straight and tight. When the moist paper was removed, a contractile force was generated and reached 14 N within 3 min. Then the film was covered by the moist paper and the stress immediately decreased and reached zero with 2 min. This cycle can be repeated at least hundreds times simply by switching the moist paper on and off. The film's response during the first two cycles tended to be a little slower. In the following cycles, both the on and off rate were faster and remained unchanged.

For the load-dependent stroke measurement, the same 25-mg film and experiment settings were used as above. The film was covered by a moist Kimwipes paper and slowly elongated approximately 2.5% to match its swelling. Then the moist paper was removed, the contractive stress within the film increased until it reached a pre-set value. Then one clamp head was released and moved as the film contracted, while the contractive stress was hold at the pre-set value. The load-dependent contraction of PEE-PPy actuator was recorded as in FIG. S10. The gravimetric work during contraction was calculated for each load, considering the width and thickness was 17 mm and 30 μm, respectively. The weight of the active film was approximately 21.7 mg. So the maximum gravimetric work during contraction value was approximately 73 J/kg, which was achieved in the 9-15 MPa loading range.

Example 7

QCM Measurement of the Water Sorption and Desorption by a PEE-PPy Film

The water response of a PEE-PPy film was monitored by a quartz crystal microbalance (QCM) using a humidity module. A thin layer of PEE-PPy was evenly deposited on a QCM sensor coated with platinum. The PEE-PPy film thickness was calculated to be about 560 nm by the frequency change of the QCM sensor, using the bulk density (1.5 g/cm3) of the PEE-PPy film. Then the sensor was loaded in the humidity module. Pure water (relative humidity=100%) or saturated LiCl solution (relative humidity=11%) was flowing inside the humidity module at 60 μL/min rate. The humidity of the 0.1 cm3 space above the sensor would change upon the change of flowing solution. It was assumed that the humidity change in the chamber of humidity module was linearly proportional to the gradual switch between pure water (100% RH) and saturated LiCl solution (11% RH). The dead liquid volume inside the humidity module was about 120 µL, meaning that it needed 2 min for one solution to completely replace another one. Therefore, the humidity change above the sensor needed at least 2 min. Upon water sorption and desorption, the PEE-PPy film weight change was calculated based on the measured frequency change of the QCM sensor.

Example 8

Locomotion Analysis

The locomotion of PEE-PPy films on a moist substrate (moist nonwoven paper containing approximately 30% water by weight) at ambient environment (room temperature 24° C., relative humidity 20%, no detectable air flow) was recorded by a video camera. The environment temperature and humidity was monitored by using an Extech hygro-thermometer pen. For each condition, 5 to 10 1-min videos were recorded and analyzed to get average flipping frequency of PEE-PPy films.

For the 25-mg PEE-PPy film lifting-up glass slides, four pieces of 1 mm-thick glass slides were glued together and the total weight was 9.5 g. The film was placed on a dry substrate and covered by the glass slides. When several drops of water were applied on the substrate around to the film, the film absorbed water and buckled up to lift up the glass slides within 3 second.

For the 25-mg film transporting cargo, bare silver wires (approximately 1 cm long, approximately 12 mg each) were attached to the edges of the film by using scotch tapes in a symmetric pattern (FIG. S11). In this manner, the gravity center of the loaded film was still at the geometry center of the film. The film with load was placed on a 35° C. moist substrate.

Example 9

Assembly of the Water-Gradient-Driven Generator and its Performance Analysis

A 10-nm Ti layer and then a 25-nm Pt layer were deposited onto both faces of a 9-µm-thick piezoelectric PVDF film (35 mm×70 mm) by vacuum sputtering as electrode. An insulated multi-strand stainless steel wire with both ends exposed was attached to each electrode at the edge using a copper conductive tape. The junctions were sealed by Kapton tapes. Then the PVDF film was dipped into a CHCl3 solution of parafilm and then taken out and dried under vacuum. In this way, the electrodes were covered by a thin layer of parafilm and electrically insulated. Then a 27-µm-thick PEE-PPy actuator (28 mm×65 mm) was attached onto one face of the PVDF film by using Kapton tapes on the four corners.

The generator was connected across a 10 MΩ resistor or a rectifying circuit with 2.2 µF capacitor using the insulated multi-strand stainless steel wires. The output voltage was recorded at 1 kHz sampling rate using an NI USB-6353 Data Acquisition Card (National Instruments). The Data Acquisition Card was controlled by a LabView software on a host computer. Post signal analysis using Fourier transform was performed using MatLab 7.0 (MathWorks). The average power output was calculated by integrating the power spectral density curve and then divided by the resistance (10 MΩ) of the resistor.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A composite material comprising
a rigid polymeric matrix comprising a pyrrole-containing polymer, where the monomer can be pyrrole or substituted pyrrole molecules or a mixture thereof,
a water-responsive gel integrated into the polymeric matrix, wherein the water-responsive gel comprises reversibly hydrolyzable bonds;
wherein the reversible hydrolysis of the reversibly hydrolyzable bond alters the structure, mechanical properties, or both of the composite material.

2. The composite material of claim 1, wherein the hydrolyzable bonds comprise ester bonds.

3. The composite material of claim 1, wherein the gel comprises a borate ester.

4. The composite material of claim 1, wherein the gel comprises an ester of a polyol or alkoxylated polyol.

5. The composite material of claim 1, wherein the gel is formed from an alkoxylated polyol having a number average molecular weight of 200 to 5,000 grams/mole.

6. The composite material of claim 5, wherein the alkoxylated polyol is crosslinked by reversibly hydrolyzable borate esters.

7. The composite material of claim 5, wherein the alkoxylated polyol is a diol, triol, or tetrol.

8. The composite material of claim 5, wherein the alkoxylated polyol is selected from the group consisting of ethoxylated diols, ethoxylated triols, ethoxylated tetrols, propoxylated diols, propoxylated triols, propoxylated tetrols, butoxylated diols, butoxylated triols, and butoxylated tetrols.

9. The composite material of claim 5, wherein the alkoxylated polyol is an alkoxylated pentaerythritol or an alkoxylated pentaerythritol derivative.

10. The composite material of claim 1, wherein the water-responsive gel is present in an amount from 5% to 25% by weight.

11. The composite material of claim 1, wherein the polymeric matrix contains a conjugated polymer.

12. The composite material of claim 1, wherein the polymeric matrix comprises a dopant.

13. The composite material of claim 1, wherein the polymeric matrix comprises a polymer selected from the group consisting of poly(pyrrole), poly(pyrazole), poly(triazole), poly(dithienopyrrole), poly(dithienopyrrolidone), poly(benzodipyrrole), poly(benzodipyrrolidone), poly(indole), poly(carbazole), poly(purine), poly(imidazole), poly(indazole), poly(benzimidazole), poly(benzotriazole), derivatives thereof, and copolymers thereof.

14. The composite material of claim 13, wherein the polymeric matrix comprises poly(pyrrole).

15. The composite material of claim 1, wherein the composite material is formed by electropolymerization.

16. The composite material of claim 1, wherein the composite material is capable of absorbing up to 5% water by weight.

17. The composite material of claim 1, wherein the composite material is environmentally stable for at least 3 months.

18. The composite material of claim 1, wherein the actuation rate of the composite material is maintained within at least 90% of initial performance for at least 100 sorption/desorption cycles.

19. The composite material of claim 1, wherein the actuation rate in the presence of water is at least 0.05 cm$^2$/s.

20. The composite material of claim 1, wherein the composite material has an electrical conductivity of at least 5 S/cm.

21. The composite material of claim 1, wherein the composite material can be stretched by more than 10% without breaking.

22. The composite material of claim 1, wherein the composite material can exhibit a power density of 0.5 W/kg to 10.0 W/kg.

23. A device comprising the composite material of claim 1.

24. The device of claim 23, further comprising a piezoelectric material.

25. The device of claim 24, wherein the piezoelectric material is polyvinylidine fluoride.

26. The device of claim 24, wherein the device generates a peak voltage of at least 1.0 V.

27. The device of claim 24, wherein the device produces an average power density of at least 20 μW/kg.

28. A method of making the composite material of claim 1 comprising integrating a water-responsive gel into a polymeric matrix.

29. The method of claim 28, wherein the polymeric matrix is formed by electropolymerization.

30. The method of claim 29, wherein the electropolymerization is performed using a titanium electrode or a titanium coated glass electrode.

31. The method of claim 29, wherein the electropolymerization comprises the electropolymerization of a pyrrole or substituted pyrrole.

32. The method of claim 28, wherein the polymeric matrix is formed in the presence of a polyol or alkoxylated polyol and boron trifluoride diethyl etherate.

* * * * *